United States Patent [19]

Potter et al.

[11] Patent Number: 5,347,086
[45] Date of Patent: Sep. 13, 1994

[54] COAXIAL DIE AND SUBSTRATE BUMPS

[75] Inventors: Curtis N. Potter; David A. Gibson, both of Austin, Tex.; Uttam S. Ghoshal, Richmond, Calif.

[73] Assignee: Microelectronics and Computer Technology Corporation, Austin, Tex.

[21] Appl. No.: 856,501

[22] Filed: Mar. 24, 1992

[51] Int. Cl.$^5$ .............................................. A05K 1/00
[52] U.S. Cl. ................................. 174/261; 174/35 R; 174/260; 228/180.1
[58] Field of Search ............... 174/32, 35 R, 257, 261, 174/260; 228/180.1; 333/18

[56] References Cited

U.S. PATENT DOCUMENTS

| | | |
|---|---|---|
| 4,705,915 | 11/1987 | Van Brunt et al. ............... 174/35 R |
| 5,002,503 | 3/1991 | Campbell et al. . |
| 5,077,598 | 12/1991 | Bartelink . |
| 5,113,764 | 5/1992 | Mandigo et al. . |

OTHER PUBLICATIONS

Aoki et al., "Low Crosstalk Packaging Design For Josephson Logic Circuits," *IEEE Transactions On Magnetics*, vol. Mag-21, No. 2, Mar. 1985, pp. 741-744.
Anderson et al., "Transmission of High Speed Electrical Signals In a Josephson Device," *IEEE Transactions on Magnetics*, vol. Mag-19, No. 3, May 1983, pp. 1182-1185.
Sato et al., "Inductance Measurement of Microconnectors for Josephson Packaging Using a Resonance Method," *IEEE Transactions on Components, Hybrids and Manufacturing Technology*, vol. CHMT-9, No. 2, Jun. 1986, pp. 145-149.
"The World's Largest Selection of Power Splitters/Combiners," *Advertisement by Mini-Circuits*, a Division of Scientific Components Corporation, F134-1 Rev A, 1990, pp. 1-2.
Inoue et al., "Microcarrier for LSI Chip Used in the HITAC M-880 Processor Group," *IEEE Transactions on Components, Hybrids, and Manufacturing Technology*, vol. 15, No. 1, Feb. 1992, pp. 7-14.
Ting et al., "Controlled Collapse Reflow For Josephson Chip Bonding," Abstract No. 80, publication and date unknown, pp. 210-211.
Simmon et al., "Electroless Bumping," *Ist International Conference on Micro Electro, Opto, Mechanical Systems and Components,* Herbert Reichl ed., Springer-Verlag, Sep. 1990, pp. 423-428.
Plotner et al., "Hybridization of Cooled Mosaic Sensors by Indium-Bumps," *Ist International Conference on Micro Electro, Opto, Mechanical Systems and Components,* Herbert Reichl ed., Springer-Verlag, Sep. 1990, pp. 429-434.
Engelmann et al., "Development of a Fine Pitch Bumping Process," *Ist International Conference on Micro Electro, Opto, Mechanical Systems and Components,* Hebert Reichl ed., Springer-Verlag, Sep. 1990, pp. 435-440.
"Controlled Collapse Reflow Chip Joining," publication and date unknown, pp. 101-126.
"Survey of Chip Joining Techniques," publication and date unknown, pp. 127-153.
Jones et al., "The Characteristics of Chip-to-Chip Signal Propagation in a Package Suitable for Superconducting Circuits," *IBM Journal of Research Development*, vol. 24, No. 2, Mar. 1990, pp. 172-177.
Totta et al., "SLT Device Metallurgy and its Monolithic Extension," *IBM Journal of Research Development*, vol. 13, May 1969, pp. 226-238.
Miller, "Controlled Collapse Reflow Chip Joining," *IBM Journal of Research Development*, vol. 13, May 1969, pp. 239-250.
Anacker, "Computing at 4 degrees Kelvin," *IEEE Spectrum*, May 1979, pp. 26-37.

*Primary Examiner*—Leo P. Picard
*Assistant Examiner*—Cheryl R. Figlin
*Attorney, Agent, or Firm*—Johnson & Gibbs

[57] ABSTRACT

A coaxial bump for connecting a die to a substrate includes a center post and a ground ring surrounding and shielding the center post. The center post may be a center conductor line, and the ground ring may be generally torus-shaped, nearly closed or completely closed. The coaxial bump provides very low crosstalk in chip-to-substrate interconnections and provides a constant impedance with negligible inductive discontinuity.

18 Claims, 2 Drawing Sheets

COAXIAL DIE AND SUBSTRATE BUMPS

U.S. GOVERNMENT LICENSE RIGHTS

The U.S. Government has a paid-up license in this invention and the right in limited circumstances to require the patent owner to license others on reasonable terms as provided for by the terms of Contract No. MDA904-90-C-5285 awarded by the Maryland Procurement Office.

BACKGROUND OF THE INVENTION

1. Field of the Invention

The present invention relates to integrated circuit fabrication and, more particularly, to structures and methods for interconnecting dies and substrates.

2. Description of Related Art

In many applications, it is necessary to provide intimate contact between a semiconductor device and the substrate to which it is mounted. Intimate contact is needed to assure a sufficient electrical connection and also sufficient thermal conductivity.

One example of the foregoing "applications" involves multilayer ceramic (MLC) technology. To overcome the limitations and the expense of MLC technology for high-performance systems, silicon wafers have heretofore been used as substrates for thin-film interconnection modules. Such silicon PC boards (SiPCBs) can provide very precise, high-density interconnects with a minimal number of metal levels. With sufficient metallization thickness, near transmission-line quality interconnects have been achieved over wafer-scale distances. SiPCBs also have very good thermal and mechanical characteristics; for example, they are virtually immune to thermal stresses, owing to the thermal expansion match between the chips and the board.

In order to physically attach and then electrically connect IC chips to a silicon wafer, three standard techniques have been successfully adapted from ceramic hybrid technology: flip-chip solder-bump reflow, wire bonding, and tape-automatic-bonding (TAB). The first listed of these methods, the solder bump method, is most relevant to the present invention. In this method, alternative layers of conductor and ceramic insulator are pressed together in the green state and fired to form a multilayer structure. Chips are provided with solder bumps on each pad and subsequently mounted upside down so that the solder bump positions on the chip correspond to interconnect areas on the ceramic multilayer.

It should not be forgotten that a main goal of the foregoing methods is to promote high speed devices. Reduced circuit dimensions act towards fulfillment of this goal. That is, to promote speed, it is desirable to interconnect chips with a minimum of capacitive loading and a minimum of interconnect length. Capacitive loading tends to slow down signal transmission such that high speeds attained on the chip cannot be maintained in communicating from one chip to another. Interconnection length between chips also contributes to propagation delay due to circuit length and also due to a self-inductance of the interconnection circuit.

Increasingly higher signal speeds have caused electrical problems to arise in the chip or die to substrate interface. These problems are particularly notable with greater than 250 MHz signals and in systems having both digital and analog signal components. Specifically, it has been found to be extremely difficult to minimize crosstalk between adjacent signal bumps and to maintain constant transmission line impedance as high speed signals traverse the interface of a die and substrate through a bump.

As bump construction plays a significant role in the present invention, some discussion of solder bump structure is appropriate here. Uniaxial solder bumps have been in use for many years and have found applicability in a wide variety of semiconductor chip to substrate or printed circuit board input/output (I/O) connections. Applications have been exploited in both the analog and digital interface areas. As technological advances have been and are continuing to be made in electronic systems with regard to higher frequency in analog applications and higher clock speed in digital systems, the standard uniaxial solder bump has been and continues to become an increasingly limiting portion of structures, especially with regard to crosstalk and impedance control. Additionally, there are emerging combined analog/digital hybrid systems where attractive applications for high speed signal processing exist but low crosstalk is essential at signal I/O's. Low crosstalk signals are extremely important where disparate signal levels are communicated via adjacent bumps. These situations arise in a variety of analog applications and in digital circuits where data signals are close to clock distribution bumps and power supply distribution bumps.

Thus, chip-to-board interconnection technology appears to be a weak point in terms of electrical performance and mechanical reliability of silicon hybrid wafer scale integration technology. It is a shortcoming and deficiency of the prior art that stringent requirements of low crosstalk and controlled impedance are not satisfactorily addressed by prior art solder bump interconnection methods.

SUMMARY OF THE INVENTION

The present invention overcomes the shortcomings and deficiencies of the prior art by providing a coaxial bump I/O configuration between die and substrate. More specifically, the present invention provides a coaxial bump for connecting a die to a substrate. The coaxial bump includes a center post and a ground ring surrounding the center post. In embodiments of the present invention the center post may be a center conductor line. In the same or in other embodiments of the present invention, the ground ring may be at least generally torus-shaped.

In addition, neither a complete ground ring nor a complete bond are necessarily required for adequate electromagnetic shielding, depending on the application. In fact, a gap or gaps in the ground ring may be desirable for allowing gas pressure release during bonding without significantly decreasing the ground ring's electromagnetic shielding capability. For example, the ground ring may have a hexagonal layout with one of the six sides removed.

The present invention also provides a method for bonding a die to a substrate including the steps of providing the substrate with a coaxial bump, providing the die with a coaxial bump, and connecting the coaxial bump on the substrate to the coaxial bump on the die. In embodiments of the method of the present invention the coaxial bumps may be at least partially formed with indium. In the same or in other embodiments of the method of the present invention, the connecting step may be accomplished by welding, at room or elevated temperature, and/or in an inert atmosphere.

Accordingly, it is an object of the present invention to provide a coaxial solder bump configuration that satisfies even the most stringent requirements for low crosstalk and controlled impedance at a die to substrate interface.

Another object of the present invention is to provide a solder bump configuration that clears the way for increasingly higher speed signal processing.

Yet another object of the present invention is to provide a die to substrate interface in which maintenance of accurately controlled impedances over a wide frequency range is possible.

Still yet another object of the present invention is to provide a die to substrate interface having a shielded center post. The shield, which may be either nearly closed or completely closed, permits only a very low level of crosstalk between the center post and adjacent signal bumps.

BRIEF DESCRIPTION OF THE DRAWINGS

Other objects, advantages, and novel features of the present invention may best be understood by reference to the following description taken in connection with the accompanying drawings in which.

DETAILED DESCRIPTION OF THE INVENTION

Figure 1:
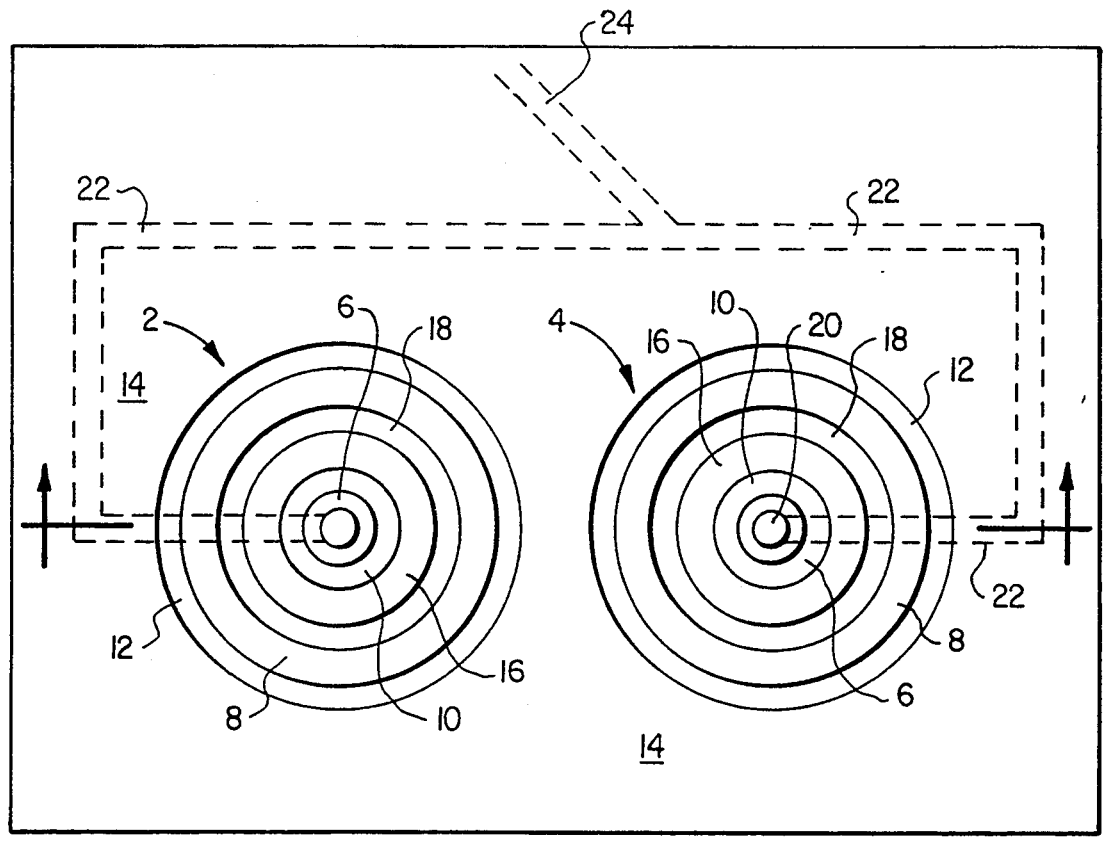
FIG. 1 is a top view of two coaxial bumps in a daisy chain section according to the teachings of the present invention.

Referring now to the drawings wherein like reference numerals are used to designate identical or similar elements throughout the several views, and wherein elements are not necessarily shown to scale, and more particularly to FIG. 1, there is shown a top view of a coaxial bump according to the teachings of the present invention. More precisely, there is shown in FIG. 1 a first bump 2 and a second bump 4 connected by a daisy chain section.

Bumps 2, 4 each comprise an inner solder bump 6 and an outer solder bump 8. Surrounding the bumps 6 and 8 are a niobium inner pad 10 and a niobium ground plane section 12, respectively. The niobium ground plane section 12 is seen through a hole in outer passivation layer 14. An inner extent of passivation shown as inner passivation 16 surrounds niobium inner pad 10, and inner niobium ground plane ring 18 is located between passivation 16 and outer bump 8. At the center of all of the foregoing is a center post via feed 20 inside inner bump 6.

Those skilled in the art should appreciate that the coaxial bump shown in FIG. 1 is effectively and essentially a donut-shaped ground ring surrounding a center post. The center post is a center conductor line surrounded by an outer ground shield.

Coaxial configurations have heretofore been used for transmission lines in microwave applications; however, perhaps because of the perceived and real difficulties encountered in fabricating such structures at a useful size for solder bump applications, the inventors of the present invention are aware of no attempts or conception of using such configurations in the art relevant hereto.

Coaxial bumps such as those shown in FIG. 1 have been fabricated and bonded by the inventors of the present invention. This demonstration of feasibility involved a superconducting substrate rendered in niobium conductors with silicon dioxide dielectric which was fabricated using indium bumps which were diffusion bonded at elevated temperature. Furthermore, it is understood that other conductors such as copper and aluminum and other dielectrics such as polyimide can be employed in the coaxial bumps of the present invention.

Continuing to refer to FIG. 1, the daisy chain section previously mentioned as connecting left coaxial bump 2 and right coaxial bump 4 may be seen to comprise a daisy chain connection 22 between the two inner bumps 6. Connection 22 has an associated lead 24 that is connected to test pads on the substrate.

Figure 2:
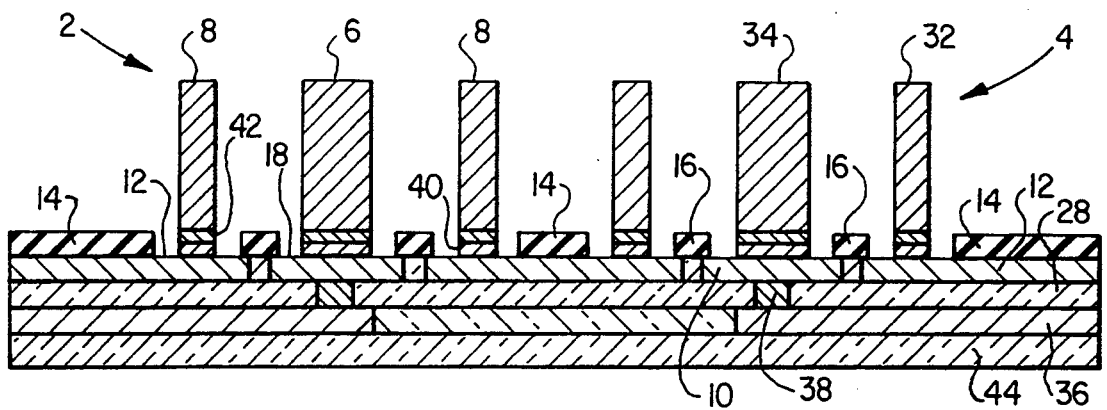
FIG. 2. is a cross-sectional view of the coaxial bumps shown in FIG. 1 taken along line 2—2

In a preferred embodiment of the present invention, a superconducting substrate using niobium conductors and a silicon dioxide inner layer dielectric may be built up using a planarized via technology with a desired, pre-determined number of layers as shown for clarity in FIGS. 1 and 2. The final top layer is the niobium ground plane 12 which is applied between a silicon dioxide layer 28 and a passivation layer 30 which includes inner passivation 16 and outer passivation 14. The ground plane may completely cover the top surface of the substrate beneath passivation 30 except where the coaxial bump's inner conductor feeds through the surface to accept a bump. The outer bump shield 32 is electrically connected to ground plane 12 while the inner conductor 34 is electrically isolated from it. A niobium line 36, which feeds to the inner conductor 34, is routed through a via 38 in the top dielectric 28 to the small niobium pad 10 which is isolated from the main niobium ground plane 12. Thus, the niobium feed line passes under the outer coaxial bump pad 32 separated electrically from the ground plane 12 by a layer of silicon dioxide 28. The dimensions of the feed line 36 (that is, its width and thickness) are chosen to yield the proper strip line impedance.

The exposed, top niobium strip line pads are metallized with a so-called barrier metal (e.g., about 2,000 angstroms thick) of palladium 40 which is solderable with indium. A thin, gold layer (e.g., also about 2,000 angstroms thick) 42 is applied to the whole surface of the wafer to act as an electrical plating interconnect and ultimately a metallic flux (due to its extreme solubility in indium) for wetting and alloying the indium to the palladium. A thick (e.g., from about 15 to about 30 microns thick) photoresist mask is applied to the gold surface, then is used as a plate up mask for plating 15 micron high indium bumps in the coaxial configuration. The thick, resist mask is stripped and the indium bump is used as a mask for etching the gold interconnect in a gold etchant which does not attack the indium bump. Underlying the entire structure shown in FIG. 2 is another silicon dioxide layer 44.

In another preferred embodiment of the present invention, which is not shown, a non-planarized structure can be built up using an alternating via technology with identical functionality to the planarized version.

The presently preferred bonding method is by cold weld where both die and substrate are bumped and indium is forced to flow against indium to effect a weld at room temperature. In this configuration, the indium bumps are reduced in height from by about 25 to 50 percent during the pressure weld operation to ensure substantial cold flow of the indium at the surface. A conventional indium oxide etchant is used just before bonding to remove the native indium oxide on the bumps to ensure cleaner weld interfaces. The actual bonding is accomplished in an inert environment to further reduce the chance of indium oxidation during the bump operation. It is understood, however, that the bumps on the die and the substrate may be connected by other conventional techniques, including a warm welding, adhesive bonding, thermosonic bonding and thermalcompression bonding. Furthermore, the bumps may be of other materials such as aluminum.

In the practice of the present invention, there is essentially no lower limit to the pitch and size of the coaxial bumps which can be made. There are, however, limits to the lithography machines used to print the bump plate-up mask which occur when the lateral dimensions of the bump approach current IC fabrication limits. Similar limits in resolution preclude bump heights of more than the lateral dimensions (that is, aspect ratios of bump heights to width of less than about one to one). Other limits are found in the positioning accuracy of the bonding tool which may be on the order of a few microns and limits on the flatness of the substrates upon which the bumps are placed. With all of these current limitations, at the present time it appears possible to fabricate coaxial bumps with diameters as small as 10 microns.

Those skilled in the art should appreciate that the present invention provides a number of novel features and advantages. For example, the present invention allows the maintenance of accurately controlled impedance through a bumped interface over a wide frequency (e.g., 20 GHz or more). The low impedances made possible by coaxial bumps also eliminates concerns with "di/dt" inductive noise in power supplies (although similar results may be possible with an array of ground bumps surrounding the supply bump). Furthermore, the nearly or completely closed nature of the shielded bump provides for a very low level of crosstalk between the shielded bump and adjacent signal bumps. This allows packing many IO's together while keeping crosstalk between them low. This latter point is an important advantage of the present invention: that is, it allows highly controlled impedances and low crosstalk at chip IO's.

The standard impedance formula for coaxial lines is:

$$Z_o = (\tfrac{1}{2}\pi) * sqrt(\mu/\epsilon) * ln(r_b/r_a)$$

where $Z_o$ is the impedance, $\mu$ is the permeability of the dielectric, $\epsilon$ is the permittivity of the dielectric, $r_a$ is the outer radius of the inner bump and $r_b$ is the inner radius of the outer shield. Using the standard impedance formula, the impedance of a coaxial bump of the present invention can be calculated to be:

$$Z_o \approx 60 * ln(r_b/r_a)$$

Thus, for example, a coaxial bump of the present invention which is placed between the pads of a die and a substrate with $r_b \approx 2.3 * r_a$ can exhibit a line impedance of about 50 ohms.

Figure 3:
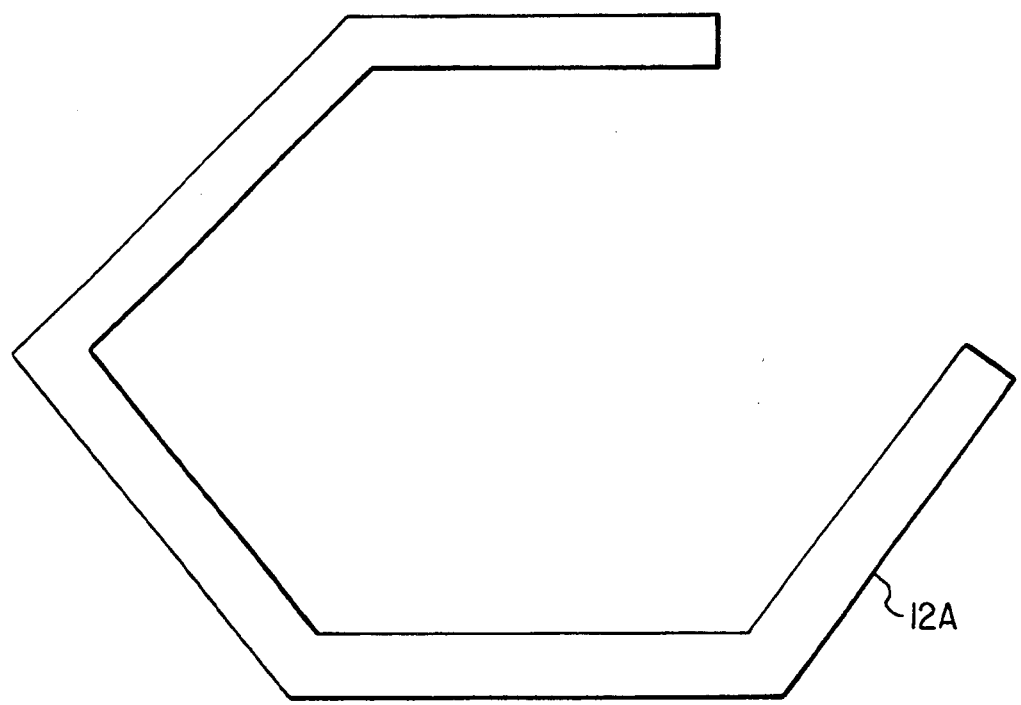
FIG. 3 is a cross-sectional view of a ground ring having a hexagonal layout with one of the six sides removed.

Obviously, numerous modifications and variations are possible in view of the above teachings. For example, discussed above is the fabrication of a superconducting substrate rendered in niobium conductors with a silicon dioxide dielectric using indium bumps which were diffusion bonded at an elevated temperature. Other die and substrate materials can be used with rather trivial changes in barrier metallurgical layers as an accommodation between bump solder and the interconnect metal. For example, copper/polyimide substrate systems can be attached to silicon MOS, bi-polar, or GaAs device types, for instance by flip-chip bonding. Furthermore, coaxial bumps (and uniaxial bumps) at least partially formed with aluminum can be connected together, such as by a fluxless aluminum weld with ultrasonic energy. The weld may be a warm weld (e.g., at 250° C.) or a cold weld (e.g., at room temperature). A fluxless weld would eliminate the need for removing residual flux within a cavity, which is particularly advantageous in the case of a closed cavity. Moreover, flip-chip bonding a die with aluminum pads to a substrate with aluminum bumps may quite possibly yield enormous economic advantages for both coaxial and uniaxial pads and bumps. Still further, as mentioned in the summary of the invention section above, a gap or gaps in the ground ring may be desirable for allowing gas pressure release during bonding without significantly decreasing the ground ring's electromagnetic capability. For example, as shown in FIG. 3, a ground ring 12A may have a hexagonal layout with one of the six sides removed. Accordingly, within the scope of the appended claims, the present invention may be practiced otherwise than as specifically described hereinabove.

What is claimed is:

1. A coaxial bump for connecting a die to a substrate, said coaxial bump comprising:
   a center conductor line; and
   a ground ring spaced from and surrounding said center conductor line wherein said ground ring provides said center conductor line with electromagnetic shielding from adjacent signal bumps thereby permitting only a very low level of crosstalk between said center conductor line and said adjacent signal bumps.

2. A coaxial bump as recited in claim 1, wherein said ground ring is at least generally torus-shaped.

3. A coaxial bump as recited in claim 2, wherein said ground ring completely surrounds said center conductor line.

4. A coaxial bump as recited in claim 3, wherein said bump contains no flux within said ground ring.

5. A coaxial bump comprising:
   a dielectric layer;
   a passivation layer;
   a ground layer disposed between said dielectric layer and said passivation layer;
   an inner bump center conductor extending through and electrically isolated from said ground layer; and
   an outer bump shield mounted atop and electrically connected to said ground layer.

6. A coaxial bump as recited in claim 5, wherein said dielectric is selected from the group consisting of silicon dioxide and polyimide.

7. A coaxial bump as recited in claim 5, wherein said ground layer is selected from the group consisting of niobium, copper and aluminum.

8. A coaxial bump as recited in claim 5, further comprising a feed within said dielectric layer connected to said inner bump center conductor and electrically isolated from said ground layer.

9. A coaxial bump as recited in claim 8, further comprising exposed, top stripline pads.

10. A coaxial bump as recited in claim 9, wherein said exposed, top stripline pads are metallized with a barrier metal.

11. A coaxial bump as recited in claim 10, wherein said barrier metal is palladium.

12. A coaxial bump as recited in claim 9, wherein said entire coaxial bump is formed on a wafer.

13. A coaxial bump as recited in claim 12, wherein said wafer has a surface which is coated with gold so as to provide a plating interconnect.

14. A coaxial bump for connecting a die to a substrate, said bump comprising:

a center conductor line; and a ground ring with at least one gap therein, said ground ring spaced from and partially surrounding said center conductor line wherein said ground ring provides said center conductor line with electromagnetic shielding from adjacent signal bumps thereby reducing crosstalk between said center conductor line and said adjacent signal bumps.

15. A coaxial bump as recited in claim 14, wherein said at least one gap does not significantly decrease the electromagnetic shielding capability of said ground ring.

16. A coaxial bump as recited in claim 15, wherein said at least one gap permits gas pressure release.

17. A coaxial bump as recited in claim 15, wherein said die is flip-chip bonded to said substrate.

18. A coaxial bump as recited in claim 15, wherein said center conductor line is at least partially formed with aluminum.

* * * * *